(12) United States Patent
Chen (10) Patent No.: US 12,334,139 B2
(45) Date of Patent: Jun. 17, 2025

(54) MEMORY DEVICE HAVING MERGED BANKS ON SUBSTRATE, AND METHOD FOR OPERATING MEMORY DEVICE

(71) Applicant: AP MEMORY TECHNOLOGY CORPORATION, Hsinchu County (TW)

(72) Inventor: Wenliang Chen, Hsinchu County (TW)

(73) Assignee: AP MEMORY TECHNOLOGY CORPORATION, Hsinchu County (TW)

( * ) Notice: Subject to any disclaimer, the term of this patent is extended or adjusted under 35 U.S.C. 154(b) by 257 days.

(21) Appl. No.: 18/332,519

(22) Filed: Jun. 9, 2023

(65) Prior Publication Data

US 2023/0410884 A1 Dec. 21, 2023

Related U.S. Application Data

(60) Provisional application No. 63/353,019, filed on Jun. 16, 2022.

(51) Int. Cl.
*G11C 11/16* (2006.01)
*G11C 11/408* (2006.01)
*G11C 11/4091* (2006.01)

(52) U.S. Cl.
CPC ...... *G11C 11/4087* (2013.01); *G11C 11/4085* (2013.01); *G11C 11/4091* (2013.01)

(58) Field of Classification Search
CPC ..................................................... G11C 11/16
See application file for complete search history.

(56) References Cited

U.S. PATENT DOCUMENTS

2005/0105986 A1 5/2005 Woolstencroft
2012/0044736 A1* 2/2012 Chung ............... G11C 13/0069
365/72

FOREIGN PATENT DOCUMENTS

CN 104715781 A 6/2015
TW 201409466 A 3/2014
TW 202205270 A 2/2022

OTHER PUBLICATIONS

Office action dated Mar. 18, 2024 for corresponding Taiwan application 112121649.

* cited by examiner

*Primary Examiner* — Jason Lappas
(74) *Attorney, Agent, or Firm* — WPAT, P.C.; Anthony King (57) ABSTRACT

A memory device includes one or more memory blocks. Each memory block includes a plurality of first sense amplifier circuits, a plurality of row segments, and a plurality of row decoders. The row segments and the first sense amplifier circuits are arranged alternately along a first direction. Each row segment includes a plurality of memory cells arranged in rows and columns. Each column of memory cells extends in the first direction. The row segments are divided into N groups of row segments, and N is greater than one. The row decoders are coupled to the row segments respectively, and divided into N groups of row decoders.

20 Claims, 11 Drawing Sheets

MEMORY DEVICE HAVING MERGED BANKS ON SUBSTRATE, AND METHOD FOR OPERATING MEMORY DEVICE

PRIORITY CLAIM AND CROSS-REFERENCE

The present application claims priority to U.S. Provisional Patent Application No. 63/353,019, filed on Jun. 16, 2022, which is incorporated by reference herein in its entirety.

BACKGROUND

The present disclosure relates to memory devices, and more particularly, to a memory device having memory banks that are merged together, and a method for operating a memory device.

Dynamic random-access memory (DRAM) is widely used as a computer's main memory because of its cost-effectiveness. A DRAM chip can be divided into multiple memory banks, which can accessed in parallel with respect to each other. The memory banks in the DRAM chip may share an internal command bus, an address bus, and a data bus. In order to increase memory bandwidth, a set of DRAM chips may be grouped as a memory rank. For example, different chips in a same memory rank can be connected to the same command bus and address bus, while connected to different data buses respectively. The memory rank can act as a wide DRAM chip having increased memory bandwidth.

SUMMARY

The described embodiments provide a memory device having memory banks that are merged together, and a method for operating a memory device.

Some embodiments described herein may include a memory device. The memory device includes one or more memory blocks. Each memory block includes a plurality of first sense amplifier circuits, a plurality of row segments, and a plurality of row decoders. The row segments and the first sense amplifier circuits are arranged alternately along a first direction. Each row segment includes a plurality of memory cells arranged in rows and columns. Each column of memory cells extends in the first direction. The row segments are divided into N groups of row segments, and N is greater than one. The row decoders are coupled to the row segments respectively, and divided into N groups of row decoders.

Some embodiments described herein may include a method for operating a memory device. The method includes: receiving an access request for activation of a target row, wherein the memory device comprises a plurality of row segment arranged along a predetermined direction, the target row is located in a predetermined row segment of the row segments, each of the row segments comprises a plurality of memory cells arranged in rows and columns, and each column of memory cells extends in the predetermined direction; determining if each neighboring row segment of the predetermined row segment is inactive, wherein each neighboring row segment of the predetermined row segment is coupled to a sense amplifier circuit enabled in response to activation of the predetermined row segment; and when it is determined that each neighboring row segment of the predetermined row segment is inactive, activating the target row to perform data access operation on the predetermined row segment.

Some embodiments described herein may include a method for operating a memory device. The method includes: disabling a predetermined row segment of the memory device, wherein the memory device comprises a plurality of row segments and a plurality of sense amplifier circuits, the row segments and the amplifier circuits are arranged alternately along a predetermined direction, each of the row segments comprises a plurality of memory cells arranged in rows and columns, each column of memory cells extends in the predetermined direction, the predetermined row segment is one of the row segments, and the row segments further comprises a first group of row segments and a second group of row segments located at opposite sides of the predetermined row segment respectively; decoding a first row address to activate a first row segment in the first groups of row segments; and decoding a second row address independent of the first row address to activate a second row segment in the second group of row segments.

With the use of the proposed memory array structure, row segments can act as pseudo-independent banks that are merged together on a substrate/wafer, and components of the memory peripheral circuitry can be disposed on outside the substrate/wafer to reduce bank overhead. The proposed memory array structure can increase memory bandwidth while keeping bank overhead low. In addition, the proposed memory array structure can achieve truly independent sub-bank access.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

The following disclosure provides many different embodiments, or examples, for implementing different features of the provided subject matter. Specific examples of components and arrangements are described below to simplify the present disclosure. These are, of course, merely examples and are not intended to be limiting. For example, the present disclosure may repeat reference numerals and/or letters in the various examples. This repetition is for the purpose of simplicity and clarity and does not in itself dictate a relationship between the various embodiments and/or configurations discussed.

Further, it will be understood that when an element is referred to as being "connected to" or "coupled to" another element, it may be directly connected to or coupled to the other element, or intervening elements may be present.

Moreover, spatially relative terms, such as "below," "above," "left," "right," and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Figure 1:
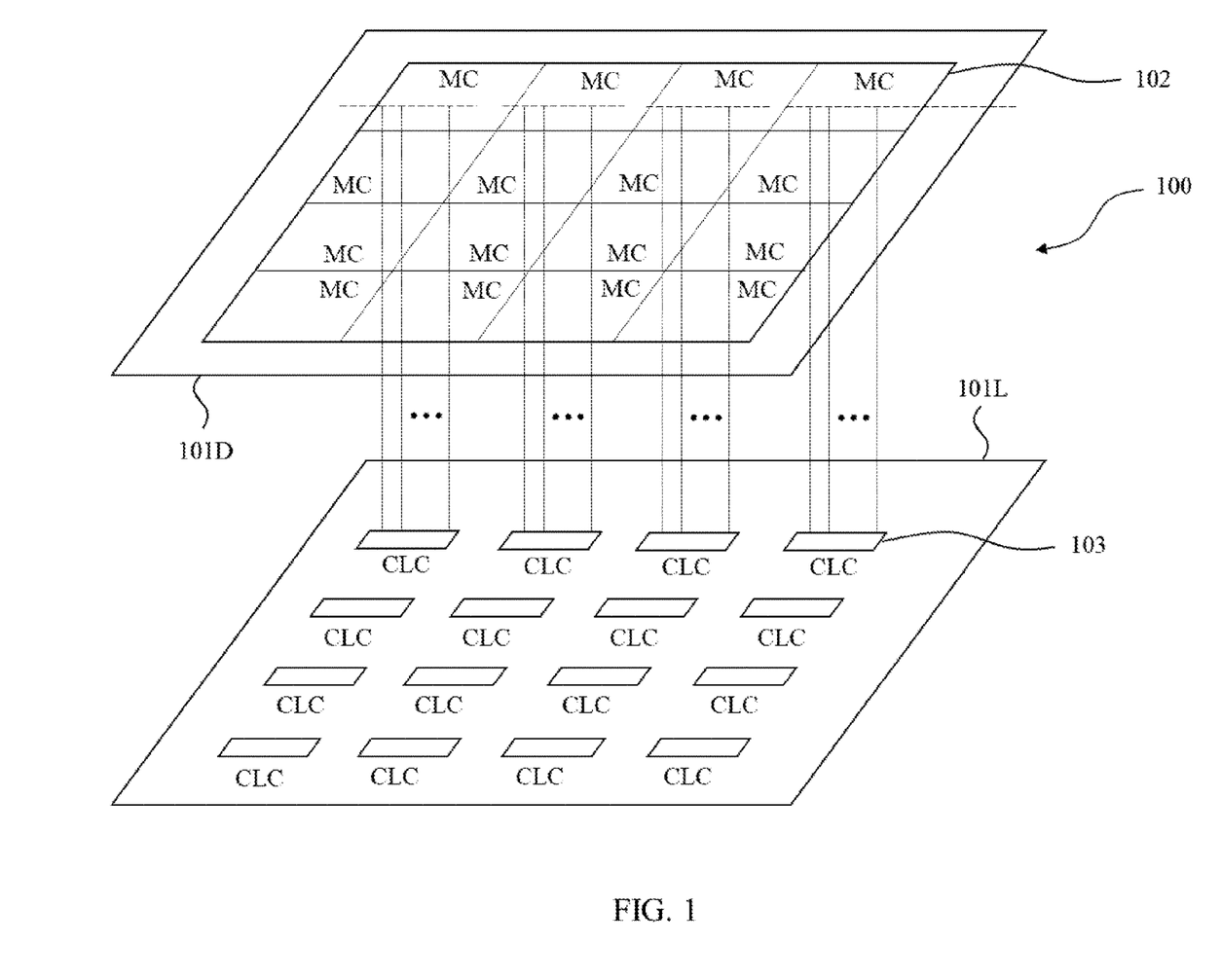
FIG. 1 is a diagram illustrating an exemplary memory device in accordance with some embodiments.

To further increase memory bandwidth, a 3D-stacked structure employing wafer-on-wafer (WoW) technology is proposed to implement a high bandwidth memory. Referring to FIG. 1, the memory device 100 can be implemented using 3D-stacked memory architecture to provide high memory bandwidth. The memory device 100 can be an electronic package which accommodates a memory die 101D and a logic die 101L stacked one above the other. In the example of FIG. 1, each memory macro/chip (MC) 102 formed on the memory die 101D can be implemented as a DRAM macro, so that the memory die 101D can be referred to as a DRAM die.

Each memory macro 102 includes one or more memory banks (not shown) that can be accessed by a corresponding control logic circuit (CLC) 103 formed on the logic die 101L. The memory banks formed on the memory die 101D can operate independently of each other, thereby providing high memory bandwidth. However, the memory die 101D may suffer from the area overhead of each memory bank caused by memory peripheral circuitry.

Figure 2:
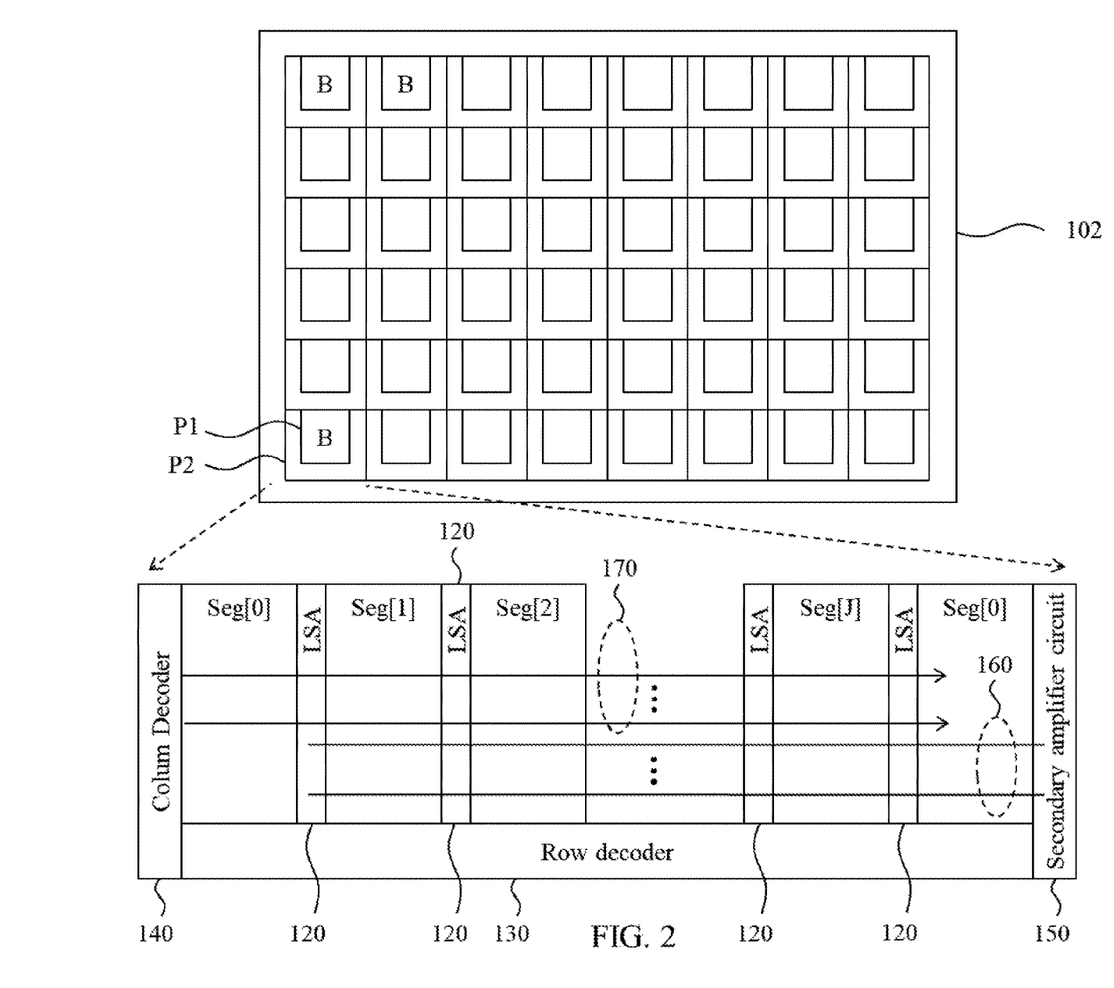
FIG. 2 illustrates an implementation of the memory macro shown in FIG. 1 in accordance with some embodiments.

FIG. 2 illustrates an implementation of the memory macro 102 shown in FIG. 1 in accordance with some embodiments. Each memory bank B may include an array of row segments Seg[0]-Seg[J], a plurality of sense amplifier circuits 120, a row decoder 130, a column decoder 140, and a sense amplifier circuit 150, where J is an integer greater than one. For illustrative purposes, each memory bank B is represented graphically as a rectangular portion P1 and a U-shaped portion P2 surrounding the rectangular portion P1. The rectangular portion P1 corresponds to the row segments Seg[0]-Seg[J] and the sense amplifier circuits 120. The U-shaped portion P2 corresponds to the row decoder 130, the column decoder 140 and the sense amplifier circuit 150. The U-shaped portion P2 may represent an area overhead of each memory bank B.

Each of the row segments Seg[0]-Seg[J] may include a plurality of memory cells (not shown) arranged in rows and columns. Memory cells in a given row share a common wordline (not shown) extending in a row direction; memory cells in a given column are coupled to a same bitline (not shown) extending in a column direction. Each sense amplifier circuit 120 is located between two row segments, and arranged to sense and amplify data signals on associated bitlines. Each sense amplifier circuit 120 may be referred to as a local sense amplifier (LSA) that can be arranged to read data from corresponding row segment(s).

The row decoder 130, shared among the row segments Seg[0]-Seg[J], can be arranged for wordline activation. For example, the row decoder 130 may decode one row address at a time for the whole memory bank B, thereby activating a wordline corresponding to the row address. The column decoder 140 can be arranged to raise one or more column select lines 170 to select corresponding sense amplifier(s) (not shown) within the sense amplifier circuits 120, thereby connecting the sense amplifier(s) to the sense amplifier circuit 150 through an input/output (I/O) bus 160 which is shared among the sense amplifier circuits 120. The sense amplifier circuit 150 may be referred to as a secondary sense amplifier or a global sense amplifier.

In the example of FIG. 2, each memory bank B may be implemented using open bitline architecture. For example, in a given row of the row segment Seg[1], a part of memory cells arranged in the row is coupled to one sense amplifier circuit 120 on the left side of the row segment Seg[1] through a part of the bitlines; another part of the memory cells is coupled to another sense amplifier circuit 120 on the right side of the row segment Seg[1] through another part of the bitlines. In addition, the physically separated row segments at the opposite edges of the array can both be labeled Seg[0] since their memory cells can be regarded as being included in the same logical row segment.

Note that a part of the bitlines located in each row segment Seg[0] is not connected to any sense amplifier circuit. Memory cells connected to this part of the bitlines may be referred to as dummy memory cells. Thus, the row segment Seg[0] at the right side of the array would be regarded as an extra overhead of the memory bank B in the open bitline architecture. As each of a large number of memory banks has its own area overhead (i.e. a U-shaped portion plus a row segment), the total area occupied by bank overhead is quite large.

The present disclosure describes exemplary memory devices, each of which includes memory banks that are merged together on a substrate or wafer, such as a memory die. Components of the memory peripheral circuitry can be disposed on another substrate or wafer to reduce area overhead. The components of the memory peripheral circuitry may include column decoder(s) and/or secondary sense amplifier(s). For example, the memory banks can be merged on a memory die of a 3D-stacked memory, and the components of the memory peripheral circuitry can be disposed on a logic die below the memory die. In addition, each row segment of a memory bank can be activated independently to act as a pseudo-independent bank, thereby increasing memory bandwidth of the memory bank. Further description is provided below.

Figure 3:
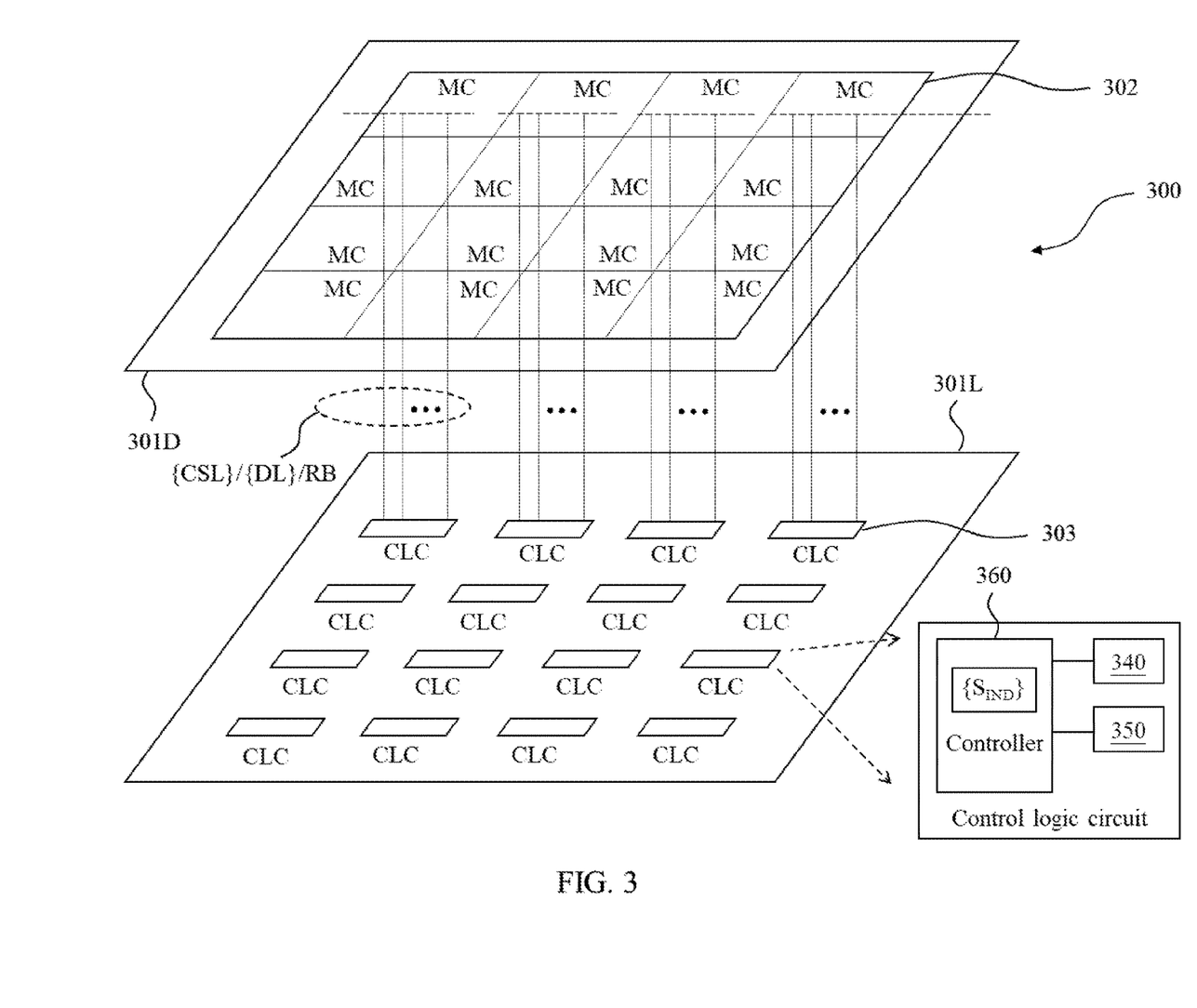
FIG. 3 is a diagram illustrating an exemplary memory device in accordance with some embodiments of the present disclosure.

FIG. 3 is a diagram illustrating an exemplary memory device in accordance with some embodiments of the present disclosure. The memory device 300 can be implemented using 3D-stacked memory architecture. The substrates 301D and 301L of the memory device 300 can be stacked one above the other using hybrid bonding. Each memory macro/ chip (MC) 302 formed on the substrate 301D can be implemented as a DRAM macro/chip. The control logic circuits 303, formed on the substrate 301L, are configured to control operation of the memory macros 302 respectively. The substrates 301D and 301L can be referred to as a memory die and a logic die, respectively.

Each memory macro 302 can include multiple banks with low area overhead. For example, numerous row segments (not shown) in each memory macro 302 can be merged on the substrate 301D to act as pseudo-independent banks. Certain memory peripheral circuit(s) associated with the row segments, such as column selection logic or secondary sense amplifier circuitry, can be formed on the substrate 301L, thus reducing bank overhead of each memory macro 302.

In the present embodiment, each control logic circuit 303 may include, but is not limited to, a column decoder 340, a sense amplifier circuit 350 and a controller 360. The column decoder 340 can be configured to control data input to and output from the memory macro 302 via a set of column select lines {CSL}. The sense amplifier circuit 350 can be configured to sense and amplify data signals on a set of data lines {DL} that are connected between the memory macro 302 and the control logic circuit 303. The sense amplifier circuit 350 can act as a secondary sense amplifier circuit. In addition, the controller 360 can be configured to control operation of the memory macro 302, the column decoder 340 and the sense amplifier circuit 350.

Figure 4:
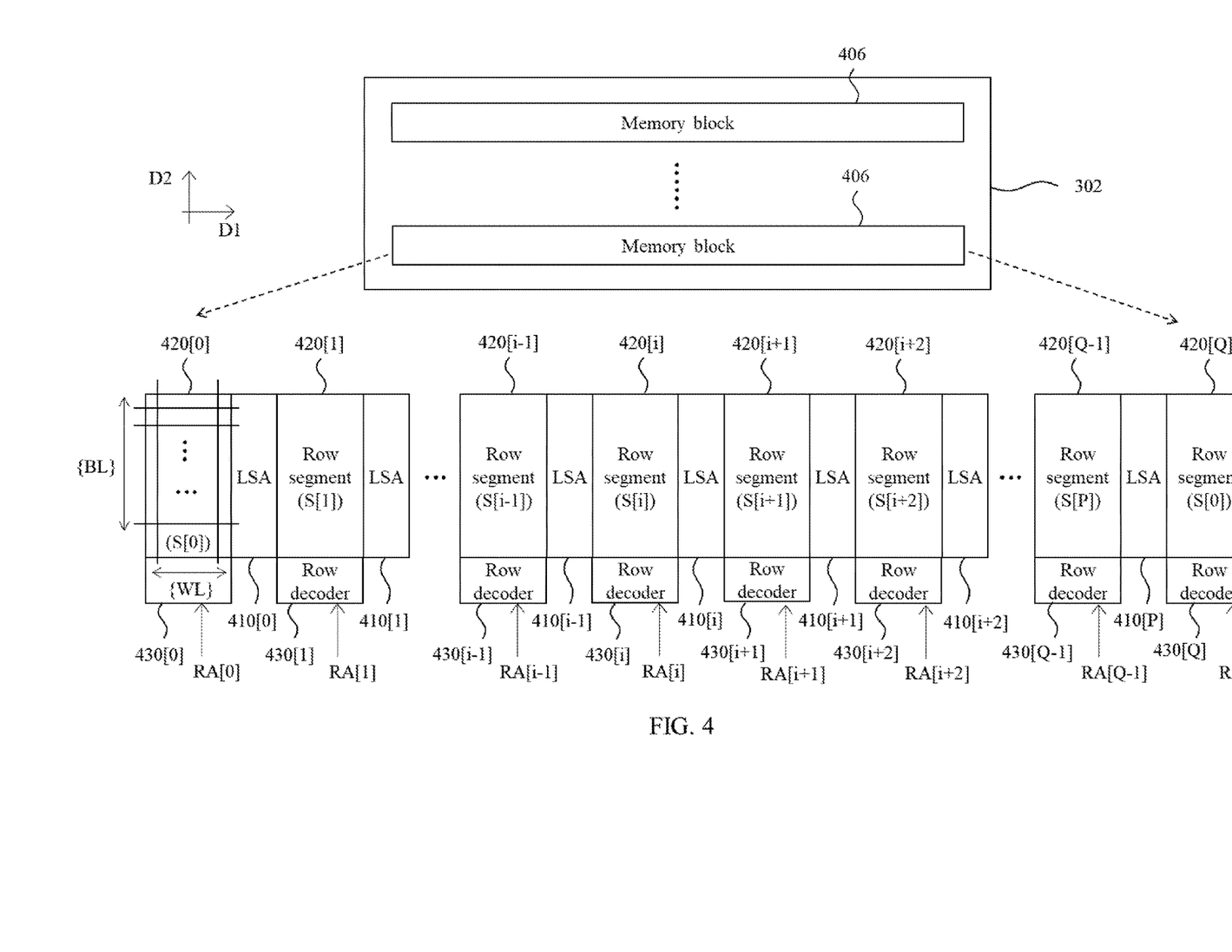
FIG. 4 is a diagram illustrating an implementation of the memory macro shown in FIG. 3 in accordance with some embodiments of the present disclosure.

FIG. 4 is a diagram illustrating an implementation of the memory macro 302 shown in FIG. 3 in accordance with some embodiments of the present disclosure. The memory macro 302 includes one or more memory blocks 406. The one or more memory blocks 406 can be accessed independently of each other. Each memory block 406 has columns that are arranged to support a predetermined page size. In the present embodiment, the one or more memory blocks 406 may have a same page size. Each memory block 406 includes, but is not limited to, a plurality of sense amplifier circuits 410[0]-410[P], a plurality of row segments 420[0]-420[Q], and a plurality of row decoders 430[0]-430[Q].

Each of the sense amplifier circuits 410[0]-410[P] includes a plurality of sense amplifiers (not shown) that can be coupled to bitlines (not shown). The sense amplifier circuits 410[0]-410[P] and the row segments 420[0]-420[Q] can be arranged alternately along a direction D1. By way of example but not limitation, P may be equal to Q minus one. Each sense amplifier circuit can be located between two consecutive row segments, and any two consecutive sense amplifier circuits can be located at opposite sides of a row segment respectively. In the example of FIG. 4, each sense amplifier circuit may serve as a local sense amplifier circuit (LSA).

Each of the row segments 420[0]-420[Q] may include a plurality of memory cells arranged in rows and columns. For example, in a given column of the row segment 420[0], memory cells are coupled to a same bitline (i.e. a bitline in the set of bitlines {BL}) that extends in the direction D1; in a given row of the row segment 420[0], memory cells share a common wordline (i.e. a wordline in the set of wordlines {WL}) that extends in a direction D2 perpendicular to the direction D1. In other words, each memory cell is arranged at an intersection of a wordline and a bitline. Each column of memory cells extends in the column direction D1, and each row of memory cells extends in the row direction D2.

The row decoders 430[0]-430[Q] are coupled to the row segments 420[0]-420[Q] respectively. Each row decoder can be arranged to decode a row address (i.e. one of the row addresses RA[0]-RA[Q]) to activate a corresponding row segment. In the example of FIG. 4, two or more of the row addresses RA[0]-RA[Q] can be independent of each other; two or more of the row segments 420[0]-420[Q] can be activated independently of each other.

Referring to FIG. 4 and also to FIG. 3, in operation, the controller 360 may output the row addresses RA[0]-RA[Q] to a row address bus RB coupled between the substrates 301D and 301L. The row decoders 430[0]-430[Q] may receive the row addresses RA[0]-RA[Q] through the row address bus RB. When one of the row segments 420[0]-420[Q] is activated, each sense amplifier circuit coupled to the activated row segment can be enabled for data access. For example, the row decoder 430[$i$] can activate the row segment 420[$i$] according to the row address RA[i]. The sense amplifier circuits 410[$i$−1] and 410[$i$] are active for accessing data associated with the row segment 420[$i$].

In addition, the column decoder 340 can raise the set of column selection lines {CSL}, thereby connecting the sense amplifier circuits 410[$i$−1] and 410[$i$] to the sense amplifier circuit 350 through the set of data lines {DL}. As the column selection logic (e.g. the column decoder 340) and the secondary sense amplifier circuit (e.g. the sense amplifier circuit 350) can be disposed outside the substrate 301D, the area overhead of the memory macros 302 can be reduced when compared with that of the memory macro 102 shown in FIG. 2.

In some embodiments, when one of the row segments 420[0]-420[Q] is activated, each neighboring row segment sharing a sense amplifier circuit (i.e. one of the sense amplifier circuits 410[0]-410[P]) with the activated row segment is inactive. For example, each sense amplifier circuit that is located between two consecutive row segments can be shared by the two consecutive row segments. When the row segment 420[$i$] is activated, two neighboring row segments 420[$i$−1] and 420[$i$+1] are inactive. Note that the sense amplifier circuit 410[$i$−1] can access not only data associated with the row segment 420[$i$] but also data associated with the row segment 420[$i$−1]. Thus, keeping the row segments 420[$i$−1] and 420[$i$+1] inactive when the row segment 420[$i$] is activated can reduce/avoid conflict in row segment activation. In addition, other row segment(s) (e.g. the row segment 420[$i$+2]) can be activated without affecting data access to the row segment 420[$i$]. The row segments 420[$i$−1]/420[$i$+1] can be activated after the row segment 420[$i$] is deactivated or precharged by the controller 360.

Moreover, the row segments 420[0]-420[Q] can be arranged as an array of row segments. The row segments 420[0] and 420[Q] are located on opposite ends of the array, respectively. When one of the row segments 420[0] and 420[Q] is activated, the other of the row segments 420[0] and 420[Q] is activated. Thus, when the row segment 420[0] or 420[Q] is activated, each of the sense amplifier circuits 410[0] and 410[Q] is enabled for data access. The row segment 420[1] (coupled to the sense amplifier circuit 410[0]) and the row segment 420[Q−1] (coupled to the sense amplifier circuit 410[Q]) can be kept inactive to reduce/avoid conflict in row segment activation.

By way of example but not limitation, memory cells in each memory block 406 can be arranged in the open bitline architecture. The row segments 420[0]-420[Q] can act as the logical row segments S[0]-S[P]. The logical row segment S[0] can be physically represented by the row segments 420[0] and 420[Q] that are located at opposite ends of the array respectively. The row address RA[0] can be identical to the row address RA[Q]. Activation of the logical row segment S[0] refers to activation of both the row segments 420[0] and 420[Q]. Note that the logical row segment S[P]

can be a neighbor of the logical row segment S[0]. Each sense amplifier circuit can be shared by two consecutive logical row segments.

Accordingly, within each memory block 406, the row segments 420[0]-420[Q] are physically arranged in continuous array-LSA-array-LSA fashion without introducing gaps to allow independent bank access. However, these row segments 420[0]-420[Q] are logically accessed pseudo-independently by a logic die. With the use of the proposed memory array structure, row segments can act as pseudo-independent banks that are merged together on a substrate/wafer, and components of the memory peripheral circuitry (e.g. a logic die) can be disposed on outside the substrate/wafer to reduce bank overhead. The proposed memory array structure can increase memory bandwidth while keeping bank overhead low.

Figure 5:
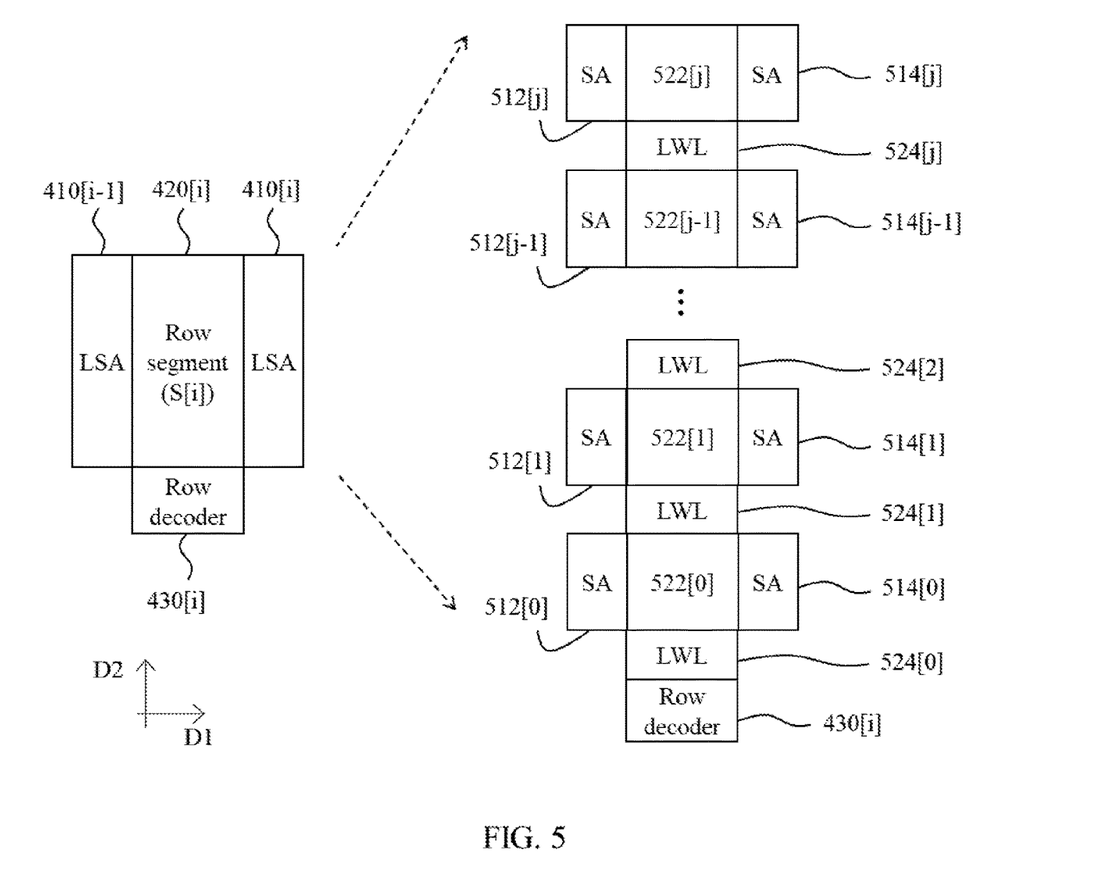
FIG. 5 is a diagram illustrating an implementation of the row segment shown in FIG. 4 in accordance with some embodiments of the present disclosure.

FIG. 5 is a diagram illustrating an implementation of the row segment 420[$i$] shown in FIG. 4 in accordance with some embodiments of the present disclosure. Those skilled in the art can appreciated that one or more of the row segments 420[0]-420[Q] shown in FIG. 4 can be implemented using the structure shown in FIG. 5 without departing from the scope of the present disclosure.

Referring to FIG. 5, memory cells of the row segment 420[$i$] can be divided into a plurality of memory cell arrays 522[0]-522[$j$] arranged along the direction D2. Each memory cell array can be implemented as a unit array. For example, the memory cell arrays 522[0]-522[$j$] may have a same number of rows and a same number of columns. In addition, the row segment 420[$i$] may include wordline drivers 524[0]-524[$j$] (labeled LWL) that are coupled to the memory cell arrays 522[0]-522[$j$] respectively. Each wordline driver can be controlled by the row decoder 430[$i$] to drive wordlines in a corresponding memory cell array.

In addition, the sense amplifier circuit 410[$i$–1] can include a plurality of sense amplifier blocks 512[0]-512[$j$] (labeled SA), and the sense amplifier circuit 410[$i$] can include a plurality of sense amplifier blocks 514[0]-514[$j$] (labeled SA). Each sense amplifier block may include sense amplifiers, each being coupled to a bitline. For example, in a given row of the memory cell array 522[0], a part of memory cells arranged in the row may be coupled to the sense amplifier block 512[0] through a part of bitlines (not shown); another part of the memory cells may be coupled to the sense amplifier block 514[0] through another part of the bitlines.

Figure 6:
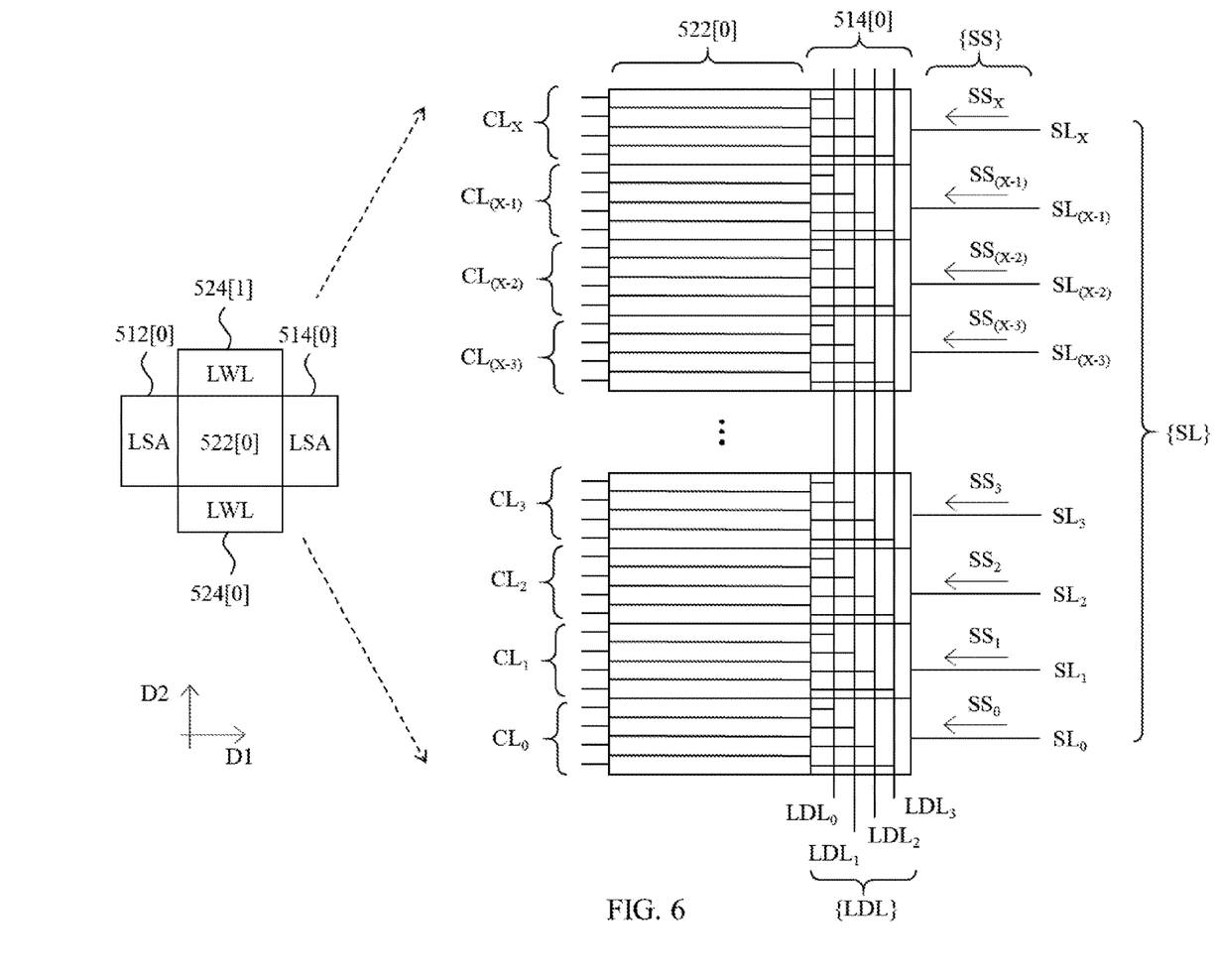
FIG. 6 illustrates an implementation of the memory cell array and the sense amplifier block shown in FIG. 5 in accordance with some embodiments of the present disclosure.

FIG. 6 illustrates an implementation of the memory cell array 522[0] and the sense amplifier block 514[0] shown in FIG. 5 in accordance with some embodiments of the present disclosure. Those skilled in the art can appreciated that other memory cell array(s) and other sense amplifier block(s) shown in FIG. 5 can be implemented using the structure shown in FIG. 6 without departing from the scope of the present disclosure.

Referring to FIG. 6, memory cells in the memory cell array 522[0] are arranged in columns that can be divided into sets of columns $CL_0$-$CL_X$, where X is a positive integer. The sense amplifier block 514[0] is coupled to a set of column select lines {SL}. The set of column select lines {SL} includes column select lines $SL_0$-$SL_X$, which can be an embodiment of at least a part of the set of column select lines {CSL} shown in FIG. 3. The sense amplifier block 514[0] is further coupled to a set of data lines {LDL}. The set of data lines {LDL} includes data lines $LDL_0$-$LDL_3$, which can be an embodiment of a part of the set of data lines {DL} shown in FIG. 3. Note that the number of data lines shown in FIG. 6 is not intended to be limiting.

Referring to FIG. 3, FIG. 5 and FIG. 6, the column decoder 340 can be configured to output a set of column select signals {SS} to the set of column select lines {SL}. The set of column select signals {SS} includes column select signals $SS_0$-$SS_X$. When the row segment 420[$i$] is activated, the sense amplifier block 514[0] can be configured to couple a set of columns in the row segment 420[$i$] to the set of data lines {LDL} according to the set of column select signals {SS}. For example, the set of columns $CL_0$ can be coupled to the data lines $LDL_0$-$LDL_3$ in response to activation of the column select line $SL_0$. Additionally or alternatively, when the row segment 420[$i$] is activated, the sense amplifier block 514[0] can be coupled to the sense amplifier circuit 350 through the set of data lines {LDL}.

Figure 7:
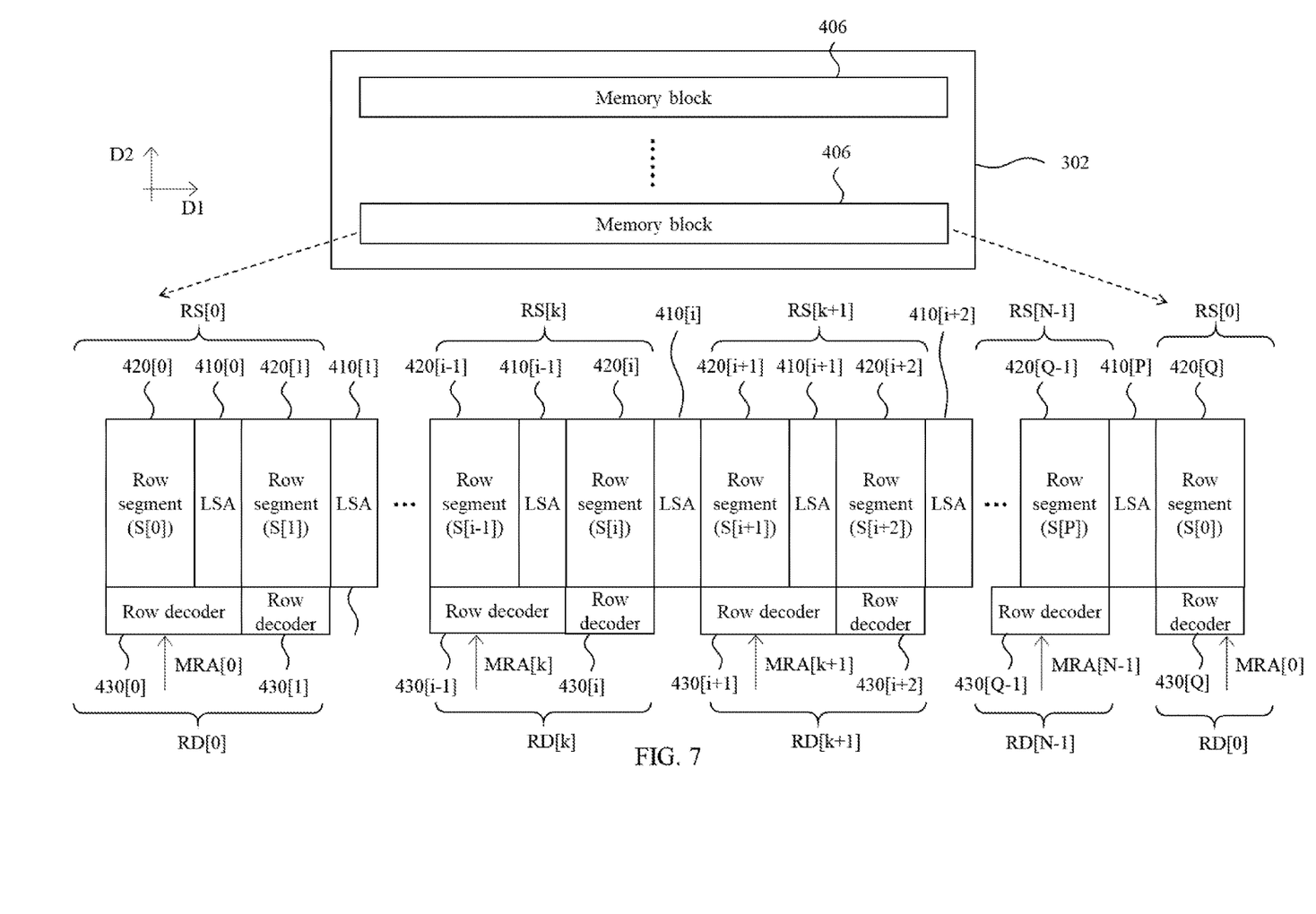
FIG. 7 is a diagram illustrating another implementation of the memory macro shown in FIG. 3 in accordance with some embodiments of the present disclosure.

FIG. 7 is a diagram illustrating another implementation of the memory macro 302 shown in FIG. 3 in accordance with some embodiments of the present disclosure. The memory block structure shown in FIG. 7 is similar/identical to that shown in FIG. 4 except that the row decoders 430[0]-430[Q] shown in FIG. 7 are divided into N groups of row decoders RD[0]-RD[N-1], where N is greater than one. In addition, the row segments 420[0]-420[Q] shown in FIG. 7 are divided into N groups of row segments RS[0]-RS[N-1].

In the embodiment shown in FIG. 7, each group of row segments includes two consecutive logical row segments. For example, the group of row segments RS[0] includes the logical row segments S[0] and S[1]; the group of row segments RS[k] includes the logical row segments S[$i$–1] and S[$i$]. The groups of row decoders RD[0]-RD[N-1] can be arranged to decode row addresses MRA[0]-MRA[N-1] independent of each other to activate the groups of row segments RS[0]-RS[N-1], respectively. Row decoders in each group of row decoders can be merged into one row decoder for managing a corresponding group of row segments.

For example, the row decoders 430[0], 430[1] and 430[Q] can be merged into one row decoder, which can be arranged to decode an independent row address MRA[0] for activating one of the row segments 420[0], 420[1] and 420[Q]. As another example, the row decoders 430[$i$–1] and 430[$i$] can be merged into one row decoder, which can be arranged to decode an independent row address MRA[k] for activating one of the row segments 420[$i$–1] and 420[$i$]. Note that when one logical row segment in a group of row segments is activated, the other logical row segment(s) in the group of row segment is inactive. For example, when the row segment 420[$i$–1] is activated, the row segment 420[$i$] is inactive. As another example, when the row segment 420[1] is activated, each of the row segments 420[0] and 420[Q] is inactive.

In some embodiments, a group of row segments may include more than two logical row segments, and row decoders coupled to the group of row segments can be merged into one row decoder. In some embodiments, different groups of row segments may have different numbers of logical row segments. In some embodiments, a single logical row segment can serve as a group of row segments. For example, the row segments 420[0]-420[Q] shown in FIG. 4 can be regarded as being divided into P groups of row segments. In other words, the row segments 420[0] and 420[Q] can serve as a group of row segments that is activated according to the row address RA[0]/RA[Q]. Each of the row segments 420[1]-420[Q-1] can serve as a group of row segments that is activated according to a corresponding row address independent of the row address RA[0]/RA[Q].

As those skilled in the art can appreciate the operation of the memory macro 302 shown in FIG. 7 after reading the above paragraphs directed to FIG. 1 to FIG. 6, further description is omitted here for brevity.

Figure 8:
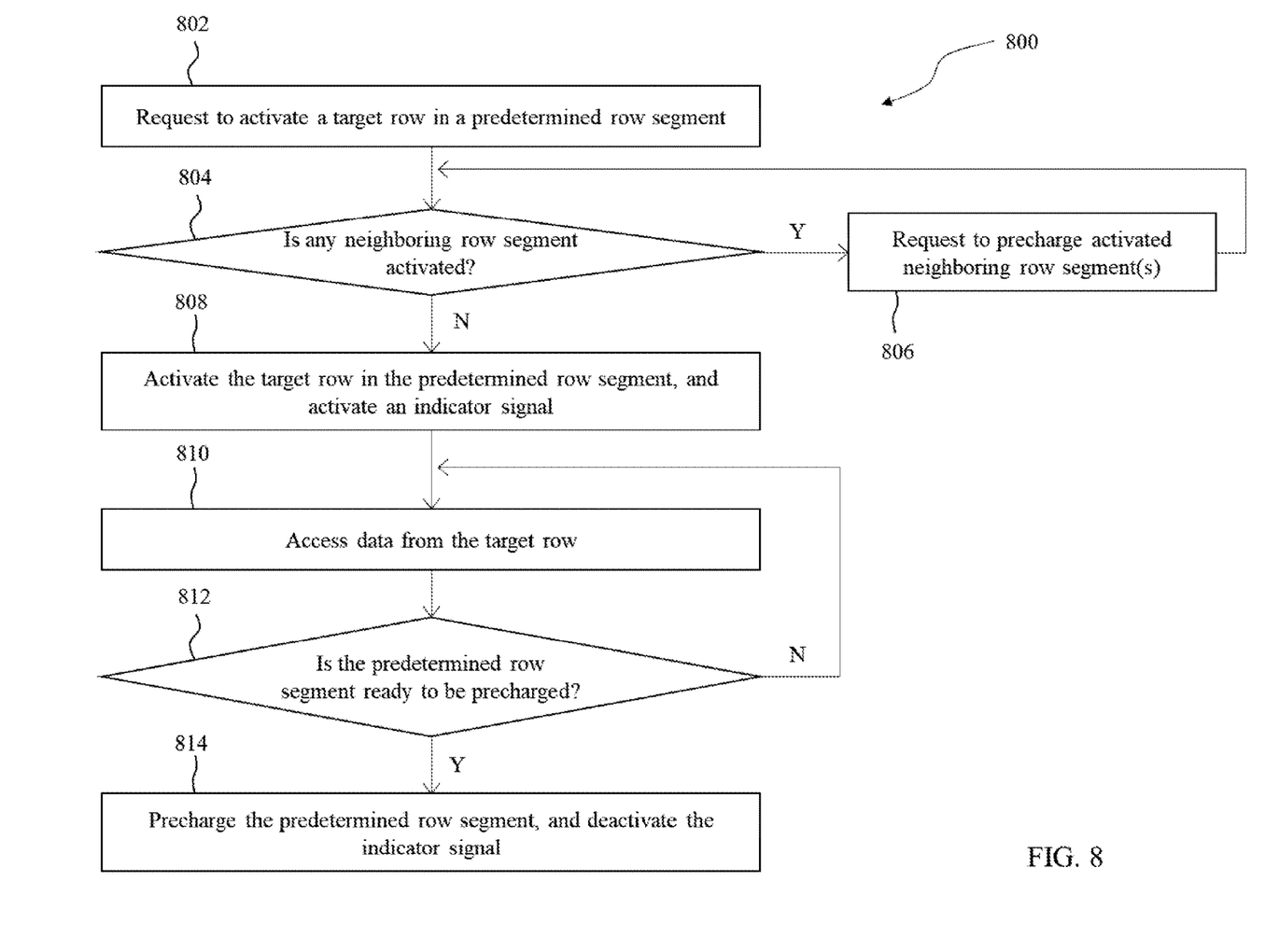
FIG. 8 is a flow chart of an exemplary method for operating a memory device in accordance with some embodiments of the present disclosure.

FIG. 8 is a flow chart of an exemplary method for operating a memory device in accordance with some embodiments of the present disclosure. The method 800 is described with reference to the memory device 300 shown in FIG. 3 and the memory macro 302 shown in FIG. 4 for illustrative purposes. Those skilled in the art should appreciate that the method 800 can be applied to the memory macro 302 shown in FIG. 7 without departing from the scope of the present disclosure. Additionally, in some embodiments, other operations in the method 800 can be performed. In some embodiments, operations of the method 800 can be performed in a different order and/or vary.

Referring to FIG. 3, FIG. 4 and FIG. 8, at operation 802, an access request for activation of a target row is received. The memory device includes a plurality of row segment arranged along a predetermined direction, and the target row is located in a predetermined row segment of the row segments. Each of the row segments includes a plurality of memory cells arranged in rows and columns, and each column of memory cells extends in the predetermined direction. For example, the controller 360 may receive an access request for activation of a target row in the row segment 420[$i$].

At operation 804, whether each neighboring row segment of the predetermined row segment is inactive is determined. Each neighboring row segment of the predetermined row segment is coupled to a sense amplifier circuit that is enabled in response to activation of the predetermined row segment. If it is determined that at least one neighboring row segment of the predetermined row segment is activated, the method 800 proceeds to operation 806; if it is determined that each neighboring row segment of the predetermined row segment is inactive, the method 800 proceeds to operation 808.

For example, the row segment 420[$i$−1] is a neighboring row segment of the row segment 420[$i$] since it is coupled to the sense amplifier circuit 410[$i$−1] that is enabled in response to activation of the row segment 420[$i$]. Similarly, the row segment 420[$i$+1] is also a neighboring row segment of the row segment 420[$i$]. The controller 360 may determine if either of the row segment 420[$i$−1] and the row segment 420[$i$+1] is activated.

In some embodiments, the controller 360 may generate a set of indicator signals {$S_{IND}$} indicative of activation status of the row segments 420[0]-420[Q]. For example, the set of indicator signals {$S_{IND}$} may include (P+1) indicator signals, which can be indicative of activation/deactivation of the logical row segments S[0]-S[P] respectively. The controller 360 may determine if either of the row segment 420[$i$−1] and the row segment 420[$i$+1] is activated by referring to the respective indicator signals associated with the row segment 420[$i$−1] and the row segment 420[$i$+1].

At operation 806, precharge of the activated neighboring row segment(s) is requested. For example, when it is determined that the row segment 420[$i$−1] is activated, the controller 360 may request precharge of the row segment 420[$i$−1]; when it is determined that the row segment 420[$i$+1] is activated, the controller 360 may request precharge of the row segment 420[$i$+1]. In some embodiments, after the precharge operation, an indicator signal associated with the row segment 420[$i$−1]/420[$i$+1] can indicate that the row segment 420[$i$−1]/420[$i$+1] is deactivated or inactive.

At operation 808, the target row in the predetermined row segment is activated. For example, the row decoder 430[$i$] may activate the target row in the row segment 420[$i$] according to the row address RA[$i$] outputted from the controller 360. In some embodiments, the controller 360 may activate an indicator signal associated with the row segment 420[$i$], so that the indicator signal can be indicative of activation of the row segment 420[$i$].

At operation 810, data access operation is performed on the predetermined row segment. For example, the control logic circuits 303 can perform associated data access operation on the row segment 420[$i$], such as a read or write access to the row segment 420[$i$].

At operation 812, whether the predetermined row segment is ready to be precharged is determined. If it is determined that the predetermined row segment is ready to be precharged, the method 800 proceeds to operation 814; otherwise, the method 800 returns to operation 810. For example, the controller 360 may determine whether the data access operation performed on the row segment 420[$i$] is completed. When it is determined that the data access operation is completed, the row segment 420[$i$] may be ready to be precharged; When it is determined that the data access operation is not completed, the row segment 420[$i$] is unready to be precharged.

At operation 814, the predetermined row segment is precharged. For example, after the data access operation performed on the row segment 420[$i$] is completed, the controller 360 may precharge the row segment 420[$i$] to thereby deactivate the row segment 420[$i$]. In some embodiments, the controller 360 may deactivate the indicator signal associated with the row segment 420[$i$], so that the indicator signal can be indicative of deactivation of the row segment 420[$i$].

In some embodiments, at operation 810, each sense amplifier circuit coupled to the predetermined row segment is enabled to access data associated with the target row. For example, the controller 360 may enable the sense amplifier circuits 410[$i$−1] and 410[$i$] to access data associated the target row in the row segment 420[$i$].

In some embodiments, the row segments of the memory device can be arranged in an array, and the predetermined row segment may a first row segment located on a first end of the array. When the first row segment is activated, a second row segment located on a second end of the array opposite to the first end is activated. Neighboring row segments of the predetermined row segment include a row segment that shares a sense amplifier circuit with the first row segment, and another row segment that shares a sense amplifier circuit with the second row segment.

For example, each of the row segments 420[1] and 420[Q−1] can serve as a neighboring row segment of the row segment 420[0]/420[Q]. Thus, the controller 360 may determine if each neighboring row segment of the row segment 420[0]/420[Q] is inactive by determining each of the row segments 420[1] and 420[Q−1] is inactive. When each of the row segments 420[1] and 420[Q−1] is inactive, it is determined that each neighboring row segment of the row segment 420[0]/420[Q] is inactive.

As those skilled in the art can appreciate the operation of the method 800 shown in FIG. 8 after reading the above paragraphs directed to FIG. 1 to FIG. 7, further description is omitted here for brevity.

Figure 9:
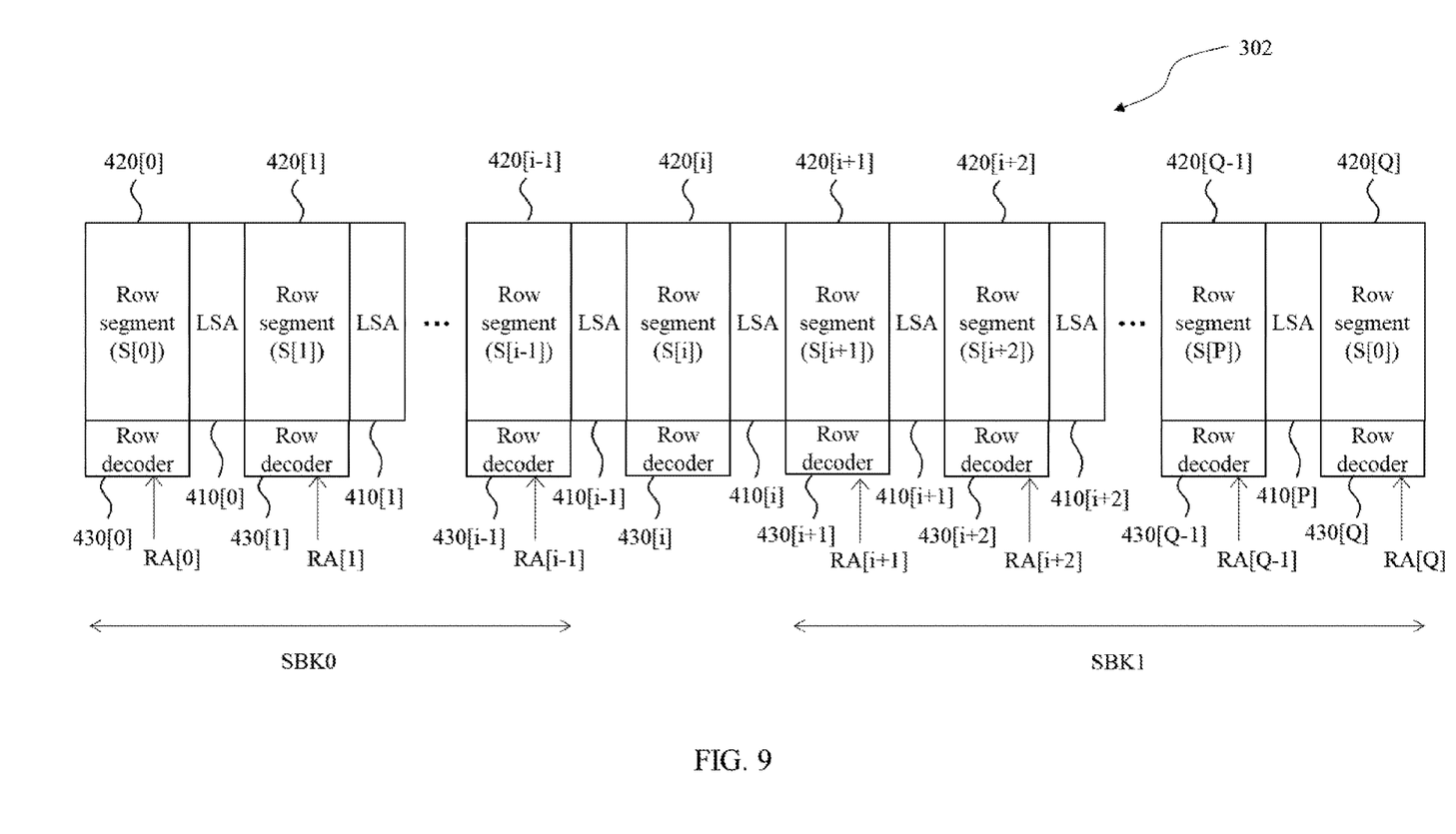
FIG. 9 is a diagram illustrating an operating scenario of the memory macro shown in FIG. 4 is illustrated in accordance with some embodiments of the present disclosure.

In some embodiments, the proposed memory array structure can achieve truly independent sub-bank access. Referring to FIG. 9, an operating scenario of the memory macro 302 shown in FIG. 4 is illustrated in accordance with some embodiments of the present disclosure. In the embodiment shown in FIG. 9, at least one row segment can be kept disabled, thus allowing two groups of row segments at opposite sides of the at least one disabled row segment to operate independently of each other.

For example, the row segment 420[$i$] can be kept disabled. Conflicting access to the row segment 420[$i$] will not occur. The row segments 420[0]-420[$i$−1] located at the left side of the row segment 420[$i$] can serve as a sub-bank SBK0; the row segments 420[$i$+1]-420[Q] located at the right side of the row segment 420[$i$] can serve as a sub-bank SBK1. The sub-banks SBK0 and SBK1 can be accessed independently since none of the sense amplifier circuits 410[0]-410[P] is shared therebetween.

Figure 10:
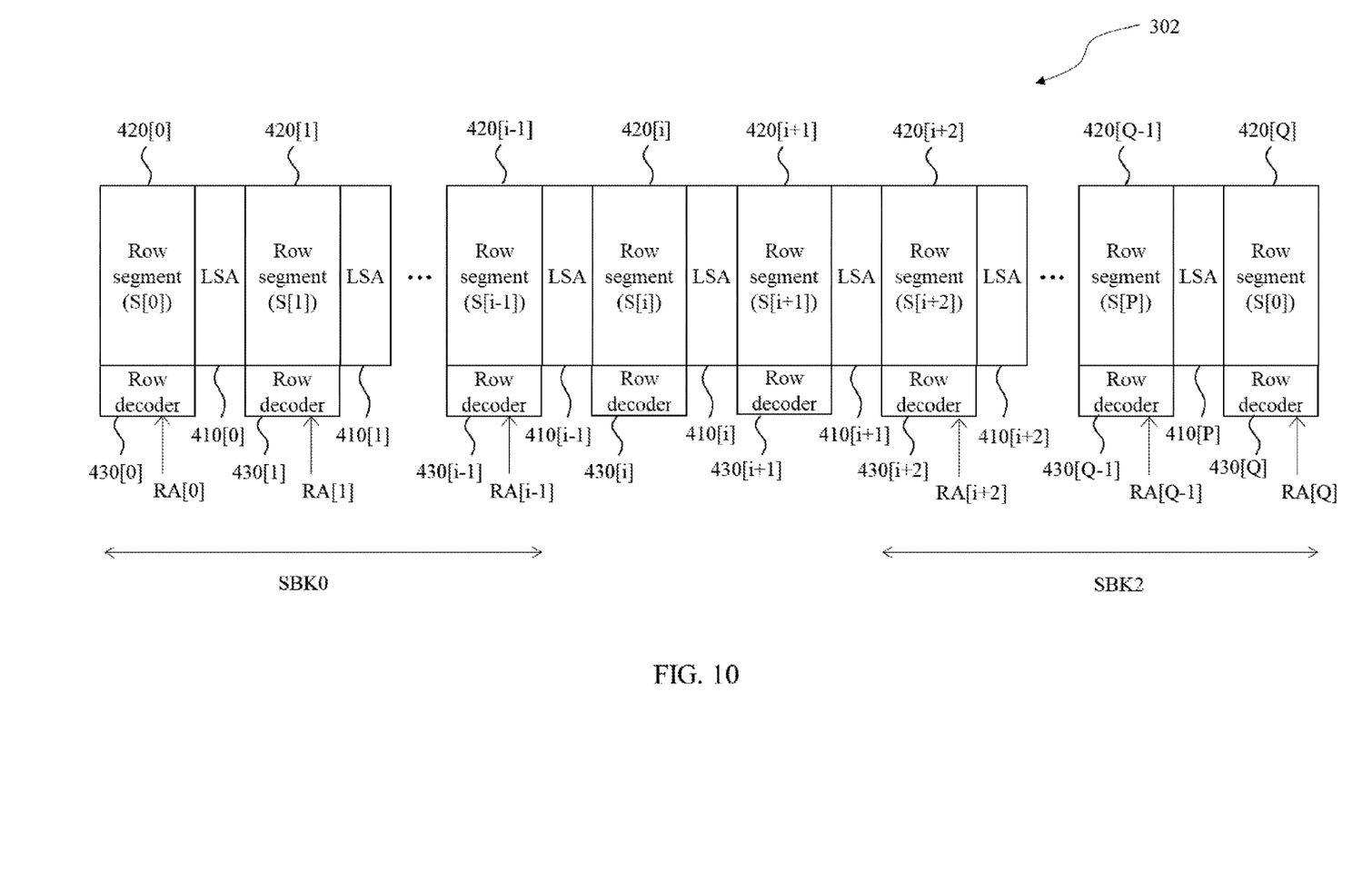
FIG. 10 is a diagram illustrating another operating scenario of the memory macro shown in FIG. 4 is illustrated in accordance with some embodiments of the present disclosure.

Note that more than one row segment can be kept disabled to implement independent sub-bank access. Referring to FIG. 10, another operating scenario of the memory macro 302 shown in FIG. 4 is illustrated in accordance with some embodiments of the present disclosure. The operation shown in FIG. 10 is similar/identical to that shown in FIG. 9 except that more than one row segment is kept disabled.

In the embodiment shown in FIG. 10, both of the row segments 420[$i$] and 420[$i$+1] can be kept disabled. The row segments 420[$i$+2]-420[Q] located at the right side of the row segment 420[$i$+1] can serve as the sub-bank SBK2. The sub-banks SBK0 and SBK2 can be accessed independently since none of the sense amplifier circuits 410[0]-410[P] is shared therebetween.

Figure 11:
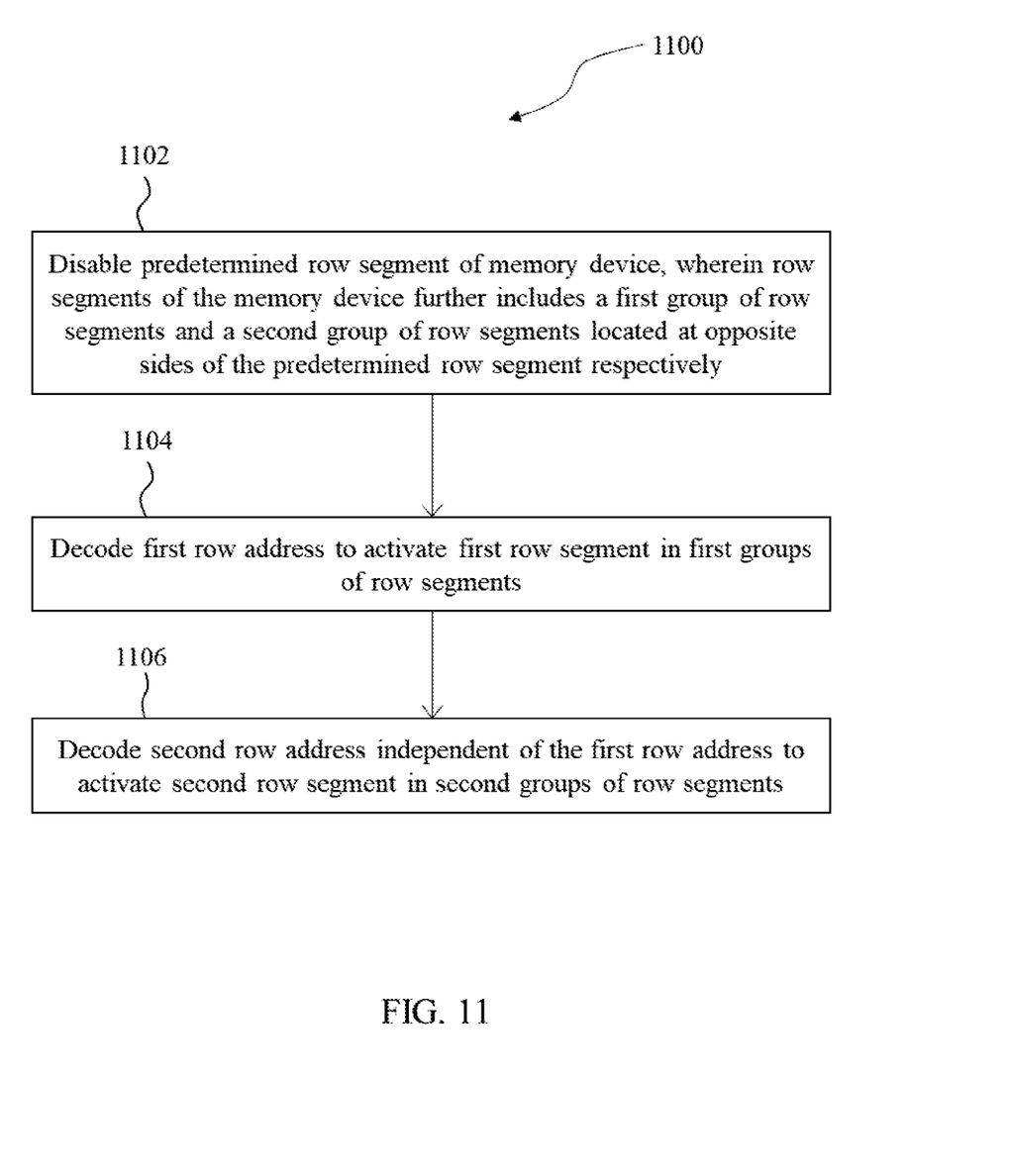
FIG. 11 is a flow chart of an exemplary method for operating a memory device in accordance with some embodiments of the present disclosure.

FIG. 11 is a flow chart of an exemplary method for operating a memory device in accordance with some embodiments of the present disclosure. The method 1100 is described with reference to the memory device 300 shown in FIG. 3 and the memory macro 302 shown in FIG. 9 for illustrative purposes. Those skilled in the art should appreciate that the method 1100 can be applied to the memory macro 302 shown in FIG. 7 and the memory macro 302 shown in FIG. 10 without departing from the scope of the present disclosure. Additionally, in some embodiments, other operations in the method 1100 can be performed. In some embodiments, operations of the method 1100 can be performed in a different order and/or vary.

At operation 1102, a predetermined row segment of the memory device is disabled. The memory device includes a plurality of row segments and a plurality of sense amplifier circuits, which are arranged alternately along a predetermined direction. Each of the row segments includes a plurality of memory cells arranged in rows and columns, and each column of memory cells extends in the predetermined direction. In addition, the predetermined row segment is one of the row segments. The row segments further includes a first group of row segments and a second group of row segments located at opposite sides of the predetermined row segment respectively.

For example, the controller 360 may disable the row segment 420[$i$]. The row segments 420[0]-420[$i$−1], which are located at the left side of the row segment 420[$i$], can serve as the sub-bank SBK0. The row segments 420[$i$+1]-420[Q], which are located at the right side of the row segment 420[$i$], can serve as the sub-bank SBK1.

At operation 1104, a first row address is decoded to activate a first row segment in the first groups of row segments. For example, the row decoder 430[$i$−1] can decode the row address RA[$i$−1] outputted from the controller 360, thereby activating the row segment 420[$i$−1].

At operation 1106, a second row address independent of the first row address is decoded to activate a second row segment in the second groups of row segments. For example, the row decoder 430[$i$+1] can decode the row address RA[$i$+1] outputted from the controller 360, thereby activating the row segment 420[$i$+1]. As the row segment 420[$i$] is kept disabled, conflicting access to the row segment 420[$i$] will not occur.

In some embodiments, each of the sub-bank SBK0 and SBK1 may be used as a memory bank employing open bitline architecture. For example, the row segments 420[0] and 420[$i$−1] can serve as a logical row segment in the sub-bank SBK0, and each row segments located between the row segments 420[0] and 420[$i$−1] can serve as a logical row segment. Thus, each of the row segments 420[0] and 420[$i$−1] can be activated in response to the row address RA[$i$−1]. Similarly, the row segments 420[$i$+1] and 420[Q] can serve as a logical row segment in the sub-bank SBK1, and each row segments located between the row segments 420[$i$+1] and 420[Q] can serve as a logical row segment. In other words, the sub-bank SBK0 and SBK1 can be accessed independently of each other.

In some embodiments, each row segment located between the first group of row segments and the second group of row segments can be disabled to implement independent sub-bank access. As those skilled in the art can appreciate the operation of the method 1100 shown in FIG. 11 after reading the above paragraphs directed to FIG. 1 to FIG. 10, further description is omitted here for brevity.

Note that the above device implementations and arrangement are provided for illustrative purposes, and are not intended to limit the scope of the present disclosure. In some embodiments, the proposed memory array structure can be applied to a folded bitline architecture, an open/folded bitline architecture, or other types of array architecture, without departing from the scope of the present disclosure. In some embodiments, row decoders can be disposed outside a substrate where the banks are merged to further reduce bank overhead. In some embodiments, the proposed memory array structure can be applied to implement planar memory devices with high bandwidth and low bank overhead.

With the use of the proposed memory array structure, row segments can act as pseudo-independent banks that are merged together on a substrate/wafer, and components of the memory peripheral circuitry can be disposed on outside the substrate/wafer to reduce bank overhead. The proposed memory array structure can increase memory bandwidth while keeping bank overhead low. In addition, the proposed memory array structure can achieve truly independent sub-bank access.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:
1. A memory device, comprising:
  one or more memory blocks, wherein each memory block comprises:
    a plurality of first sense amplifier circuits;

a plurality of row segments, the row segments and the first sense amplifier circuits being arranged alternately along a first direction, wherein each row segment comprises a plurality of memory cells arranged in rows and columns, and each column of memory cells extends in the first direction; the row segments are divided into N groups of row segments, and N is greater than one; and a plurality of row decoders, coupled to the row segments respectively, the row decoders being divided into N groups of row decoders.

2. The memory device of claim 1, wherein the N groups of row decoders are arranged to decode N row addresses independent of each other to activate the N groups of row segments, respectively.

3. The memory device of claim 1, wherein when one of the row decoders is arranged to activate one of the row segments, each neighboring row segment sharing one of the first sense amplifier circuits with the activated row segment is inactive.

4. The memory device of claim 1, wherein when one of the row decoders is arranged to activate one of the row segments, each first sense amplifier circuit coupled to the activated row segment is enabled for data access.

5. The memory device of claim 1, wherein a group of row segments in the N groups of row segments comprises more than one row segment; when one of the row decoders is arranged to activate one row segment in the group of row segments, another row segment in the group of row segments is inactive.

6. The memory device of claim 1, wherein the row segments are arranged in an array; a group of row segments in the N groups of row segments comprises a first row segment and a second row segment located on opposite ends of the array respectively; when one of the row decoders is arranged to activate one of the first row segment and the second row segment, the other of the first row segment and the second row segment is activated.

7. The memory device of claim 1, further comprising:
a first substrate and a second substrate stacked one above other, wherein the row segments and the first sense amplifier circuits are formed on the first substrate;
a set of column select lines, connected between the first substrate and the second substrate;
a column decoder, formed on the second substrate and coupled to the set of column select lines, the column decoder being configured to output a set of column select signals to the set of column select lines; and
a set of data lines, wherein when one of the row decoders is arranged to activate one of the row segments, a first sense amplifier circuit coupled to the activated row segment is configured to couple a set of columns in the activated row segment to the set of data lines according to the set of column select signals.

8. The memory device of claim 1, further comprising:
a first substrate and a second substrate stacked one above other, wherein the row segments and the first sense amplifier circuits are formed on the first substrate;
a second sense amplifier circuit, formed on the second substrate; and
a set of data lines, connected between the first substrate and the second substrate, wherein when one of the row decoders is arranged to activate one of the row segments, a first sense amplifier circuit coupled to the activated row segment is coupled to the second sense amplifier circuit through the set of data lines.

9. The memory device of claim 1, further comprising:
a first substrate and a second substrate stacked one above other, wherein the row decoders are formed on the first substrate;
a row address bus, coupled between the first substrate and the second substrate; and
a controller, formed on the second substrate, the controller being configured to output the N row addresses to the N groups of row decoders through the row address bus.

10. The memory device of claim 1, wherein each row of memory cells extends in a second direction perpendicular to the first direction, and the memory cells are divided into a plurality of memory cell arrays arranged along the second direction; each row segment further comprises:
a plurality of wordline drivers, coupled to the memory cell arrays respectively, wherein each wordline driver is controlled by a row decoder corresponding to the row segment to drive wordlines in a corresponding memory cell array.

11. The memory device of claim 1, wherein the one or more memory blocks have a same page size.

12. A method for operating a memory device, comprising:
receiving an access request for activation of a target row, wherein the memory device comprises a plurality of row segments arranged along a predetermined direction, and the target row is located in a predetermined row segment of the row segments; each of the row segments comprises a plurality of memory cells arranged in rows and columns, and each column of memory cells extends in the predetermined direction;
determining if each neighboring row segment of the predetermined row segment is inactive, wherein each neighboring row segment of the predetermined row segment is coupled to a sense amplifier circuit enabled in response to activation of the predetermined row segment; and
when it is determined that each neighboring row segment of the predetermined row segment is inactive, activating the target row to perform data access operation on the predetermined row segment.

13. The method of claim 12, further comprising:
when it is determined that at least one neighboring row segment of the predetermined row segment is activated, precharging the at least one neighboring row segment.

14. The method of claim 12, further comprising:
after the data access operation, precharging the predetermined row segment.

15. The method of claim 12, wherein the step of activating the target row to perform the data access operation on the predetermined row segment comprises:
enabling each sense amplifier circuit coupled to the predetermined row segment to access data associated with the target row.

16. The method of claim 12, further comprising:
generating an indicator signal indicative of whether the predetermined row segment is activated;
wherein the indicator signal is indicative of activation of the predetermined row segment when the target row is activated, and is indicative of deactivation of the predetermined row segment when the predetermined row segment is precharged.

17. The method of claim 12, wherein the row segments are arranged in an array, and the predetermined row segment is a first row segment located on a first end of the array; the row segments further comprises a second row segment located on a second end of the array opposite to the first end; when one of the first row segment and the second row segment is activated, the other of the first row segment and the second row segment is activated; the step of determining if each neighboring row segment of the predetermined row segment is inactive comprises:

determining if a third row segment sharing a first sense amplifier circuit with the first row segment is inactive, wherein the first sense amplifier circuit is enabled in response to activation of the first row segment; and     determining if a fourth row segment sharing a second sense amplifier circuit with the second row segment is inactive, wherein the second sense amplifier circuit is enabled in response to activation of the second row segment;

wherein when each of the third row segment and the fourth segment is inactive, it is determined that each neighboring row segment is inactive.

18. A method for operating a memory device, comprising:

disabling a predetermined row segment of the memory device, wherein the memory device comprises a plurality of row segments and a plurality of sense amplifier circuits; the row segments and the amplifier circuits are arranged alternately along a predetermined direction; each of the row segments comprises a plurality of memory cells arranged in rows and columns, and each column of memory cells extends in the predetermined direction; the predetermined row segment is one of the row segments; the row segments further comprises a first group of row segments and a second group of row segments located at opposite sides of the predetermined row segment respectively;

decoding a first row address to activate a first row segment in the first groups of row segments; and     decoding a second row address independent of the first row address to activate a second row segment in the second group of row segments.

19. The method of claim 18, wherein the step of disabling the predetermined row segment comprises:

disabling each row segment located between the first group of row segments and the second group of row segments.

20. The method of claim 18, wherein the first group of row segments is arranged as an array of row segments along the predetermined direction; the first row segment is located on a first end of the array; the method further comprises:

decoding the first row address to activate a third row segment located on a second end of the array opposite to the first end.

* * * * *